US009468097B2

(12) United States Patent
Matsuda

(10) Patent No.: US 9,468,097 B2
(45) Date of Patent: Oct. 11, 2016

(54) RESIN COMPOSITION FOR PRINTED CIRCUIT BOARD, PREPREG FOR PRINTED CIRCUIT BOARD, LAMINATE, METAL-CLAD LAMINATE, PRINTED CIRCUIT BOARD, AND MAGNESIUM OXIDE, AND METHOD FOR MANUFACTURING MAGNESIUM OXIDE

(71) Applicant: Panasonic Intellectual Property Management Co., Ltd., Osaka (JP)

(72) Inventor: Takashi Matsuda, Fukushima (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/734,015

(22) Filed: Jun. 9, 2015

(65) Prior Publication Data
US 2015/0366056 A1 Dec. 17, 2015

(30) Foreign Application Priority Data

Jun. 16, 2014 (JP) .................................. 2014-123370

(51) Int. Cl.
*H05K 1/00* (2006.01)
*H05K 1/03* (2006.01)
(Continued)

(52) U.S. Cl.
CPC ............. *H05K 1/0373* (2013.01); *B32B 5/022* (2013.01); *B32B 15/14* (2013.01); *B32B 15/20* (2013.01); *C01F 5/06* (2013.01); *C01F 5/08* (2013.01); *C04B 14/304* (2013.01); *C04B 26/14* (2013.01); *C08K 3/22* (2013.01); *H05K 1/0366* (2013.01); *B32B 2260/021* (2013.01);
(Continued)

(58) Field of Classification Search
CPC ............ H05K 1/03; B32B 5/02; B32B 5/16; B32B 5/28; C01F 5/02; C01F 5/08; C01F 17/00
USPC ........ 174/250, 254, 255, 258; 423/263, 608, 423/618, 636; 428/402
See application file for complete search history.

(56) References Cited

U.S. PATENT DOCUMENTS 5,844,309 A * 12/1998 Takigawa ................ H01L 23/10
257/701
6,303,091 B1 * 10/2001 Mohri ..................... C01B 13/14
423/263

(Continued)

FOREIGN PATENT DOCUMENTS

| EP | 2455339 | 5/2012 |
|---|---|---|
| JP | 61-085474 | 5/1986 |
| WO | 2011/007638 | 1/2011 |

*Primary Examiner* — Xiaoliang Chen
(74) *Attorney, Agent, or Firm* — Greenblum & Bernstein, P.L.C.

(57) ABSTRACT

A resin composition for printed circuit board contains a thermosetting resin and an inorganic filler containing magnesium oxide. A volume average particle size of the magnesium oxide is from 2 μm to 10 μm, inclusive. In a distribution of a particle size of the magnesium oxide, the particle size has maximal frequencies in a first range of from 0.3 μm to 1 μm, inclusive, and in a second range of from 2 μm to 10 μm, inclusive, a maximal volume frequency in the first range is 5% or less, and a maximal volume frequency in the second range is 12% or more. A ratio of 50% accumulated particle size D50 with respect to specific surface area diameter of the magnesium oxide is 4 or less, and a ratio of 90% accumulated particle size D90 with respect to 10% accumulated particle size D10 of the magnesium oxide is 10 or less.

7 Claims, 4 Drawing Sheets

(51) Int. Cl.
  *C01F 5/08* (2006.01)
  *C01F 5/06* (2006.01)
  *C08K 3/22* (2006.01)
  *B32B 15/14* (2006.01)
  *B32B 5/02* (2006.01)
  *B32B 15/20* (2006.01)
  *C04B 26/14* (2006.01)
  *C04B 14/30* (2006.01)

(52) U.S. Cl.
  CPC ... *B32B 2260/046* (2013.01); *B32B 2307/206* (2013.01); *B32B 2307/304* (2013.01); *B32B 2307/306* (2013.01); *B32B 2307/7265* (2013.01); *B32B 2457/08* (2013.01); *C01P 2004/51* (2013.01); *C01P 2004/61* (2013.01); *C01P 2006/12* (2013.01); *C08K 2003/222* (2013.01); *Y10T 428/2982* (2015.01); *Y10T 442/2672* (2015.04); *Y10T 442/3455* (2015.04); *Y10T 442/656* (2015.04)

(56) References Cited

U.S. PATENT DOCUMENTS

| | | | | |
|---|---|---|---|---|
| 8,603,624 | B2* | 12/2013 | Matsuda | B32B 5/28 174/258 |
| 2010/0163783 | A1* | 7/2010 | Fung | C08G 59/304 252/73 |
| 2011/0014469 | A1* | 1/2011 | Nakagawa | C01F 5/02 428/402 |
| 2012/0100770 | A1* | 4/2012 | Fung | C08L 63/00 442/59 |
| 2012/0189850 | A1* | 7/2012 | Ohsaki | C01F 5/08 428/402 |
| 2012/0228010 | A1* | 9/2012 | Matsuda | B32B 5/28 174/254 |
| 2013/0215628 | A1* | 8/2013 | Matsuda | C08L 5/24 362/382 |
| 2014/0079913 | A1* | 3/2014 | Nishiyama | B32B 27/20 428/148 |
| 2014/0087614 | A1* | 3/2014 | Matsuda | C08J 5/24 442/59 |
| 2015/0263325 | A1* | 9/2015 | Honda | H01M 10/0525 429/145 |
| 2015/0291767 | A1* | 10/2015 | Owada | C08G 64/00 524/611 |

* cited by examiner

RESIN COMPOSITION FOR PRINTED CIRCUIT BOARD, PREPREG FOR PRINTED CIRCUIT BOARD, LAMINATE, METAL-CLAD LAMINATE, PRINTED CIRCUIT BOARD, AND MAGNESIUM OXIDE, AND METHOD FOR MANUFACTURING MAGNESIUM OXIDE

BACKGROUND

1. Technical Field

The present disclosure relates to a resin composition for printed circuit board, a prepreg for printed circuit board, an insulating substrate, a metal-clad laminate, a printed circuit board, magnesium oxide, and a method for manufacturing magnesium oxide.

2. Description of the Related Art

There is a demand for electronic devices to be reduced in size and weight. On the other hand, with an increase in the information processing amount of electronic devices, it is required to enhance performance of the electronic devices. In order to meet these demands, it is required to improve mounting technologies, such as high integration of electronic components such as semiconductor devices to be installed in electronic devices, and densification and multi-layering of wirings.

For example, it is required to more densely mount electronic components on a printed circuit board. In the case of a printed circuit board having electronic components densely mounted thereon, a heat amount generated in per unit area is increased. Further, the use of electronic components having a relatively large amount of heat generation, for example, LEDs (light emitting diodes) results in a significant increase in heat generation.

In order to reduce defects due to the increased heat generation, it is necessary to improve the heat dissipation characteristics of the printed circuit board.

In order to improve the heat dissipation characteristics of the printed circuit board, there is proposed a way of blending a resin component for forming a printed-wiring board with magnesium oxide having high thermal conductivity as an inorganic filler. The magnesium oxide has not only high thermal conductivity but also excellent electrical insulation. Thus, blending of the resin component with the magnesium oxide as an inorganic filler allows for improvement in product stability such as increased insulation between wirings as well as increased heat dissipation of the printed circuit board.

Magnesium oxide particles are categorized into light-calcined magnesium oxide (about 600° C. to 900° C.) and dead-calcined magnesium oxide (about 1,100° C. to 1,500° C.) in accordance with the calcination temperature. The former is used for utilizing the excellent chemical activity for the neutralization of acids and halogens. One typical example of such use is an acid acceptor for halogenated rubbers such as chloroprene and chlorosulfonated polyethylene. The latter is used for utilizing the excellent physical properties of magnesium oxide particles, i.e., high-melting point (about 2,800° C.), high electrical insulation at high temperature, translucency over a wide wavelength range, and high thermal conductivity. Specifically, the latter is used in articles which take advantage of the excellent physical properties of magnesium oxide particles, such as a heat-resistant container, a heat-resistant component, a heat insulating material, an integrated circuit (IC) substrate, a lens, a sodium lamp container, a sheath heater, a filler for resin compositions, and a polishing material.

However, magnesium oxide particles are gradually corroded with water or steam and converted to magnesium hydroxide particles (hydration). Thus, the various excellent physical properties are lost, whereby the scope of its use is limited.

The same holds for a printed circuit board containing magnesium oxide. Even if the heat dissipation is high, the product stability is low. Hence, the conversion of magnesium oxide contained in the printed circuit board to magnesium hydroxide results in expansion of the volume of the inorganic filler. As a result, the resin component may be released from a fiber base member which forms the printed circuit board. The occurrence of releasing of the resin component causes the product stability of the printed circuit board to decrease, for example, damages on the strength and insulation of the printed circuit board.

In order to reduce the occurrence of such defects, the use of magnesium oxide having reduced reactivity is studied. It is proposed that such magnesium oxide is manufactured by the following method.

Unexamined Japanese Patent Publication No. 61-85474 proposes a method for calcining magnesium oxide at 1600° C. or more and less than melting temperature (2800° C.). However, the magnesium oxide calcined by the method forms a large lump. Thus, a vigorous grinding process is necessary to form fine particles. Performing the vigorous grinding process on the magnesium oxide causes breaks in single crystals of magnesium oxide particles finally grown and various lattice defects on the surfaces of the crystals. As a result, the water resistance is not satisfied, the contour becomes irregular, and the flowability is low. Thus, it is difficult to highly fill a resin with the magnesium oxide particles.

Another method for manufacturing a low-reactive magnesium oxide includes, for example, an electromelting method. Magnesium oxide obtained by the electromelting method also forms a relatively large lump. Therefore, there remains the same problem as that in the case of the high temperature calcination as described above. Moreover, the electromelting method causes an increase in cost.

Another way is considered to control a particle size of magnesium oxide to be contained in a printed circuit board. For example, PCT International Publication No. WO 2011/007638 (hereinafter referred to as "PTL") discloses magnesium oxide particles having a controlled particle size. Specifically, PTL discloses magnesium oxide particles having a ratio of (median diameter)/(specific surface area diameter determined from specific surface area) of 3 or less and a D90/D10 of 4 or less. Further, PLT discloses that the magnesium oxide particles are used as high heat dissipative material.

SUMMARY

The present disclosure provides a resin composition for printed circuit board capable of forming a printed circuit board that is excellent in product stability such as moisture resistance and has high heat dissipation. Further, the present disclosure provides a prepreg for printed circuit board which includes the resin composition for printed circuit board, and further provides an insulating substrate, a metal-clad laminate, and a printed circuit board, which are produced using the prepreg. Further, the present disclosure provides magnesium oxide which is contained in the resin composition for printed circuit board.

A resin composition for printed circuit board according to an aspect of the present disclosure contains a thermosetting resin and an inorganic filler containing magnesium oxide. The magnesium oxide has a volume average particle size of from 2 μm to 10 μm, inclusive. In a distribution of a particle size of the magnesium oxide, the particle size has a maximal frequencies in a first range of from 0.3 μm to 1 μm, inclusive, and in a second range of from 2 μm to 10 μm, inclusive, a maximal volume frequency in the first range is 5% or less, and a maximal volume frequency in the second range is 12% or more. A ratio of 50% accumulated particle size D50 with respect to specific surface area diameter of the magnesium oxide is 4 or less, and a ratio of 90% accumulated particle size D90 with respect to 10% accumulated particle size D10 of the magnesium oxide is 10 or less.

A prepreg according to another aspect of the present disclosure is obtained by impregnating a base member with the resin composition for printed circuit board and semi-hardening the impregnated base member.

An insulating substrate according to another aspect of the present disclosure is obtained by hardening the prepreg.

A metal-clad laminate according to another aspect of the present disclosure is obtained by laminating metal foil on the prepreg and heat press-molding the laminated body for integration.

A printed circuit board according to another aspect of the present disclosure is obtained by removing a part of the metal foil of the metal-clad laminate so as to form a conductor pattern.

Magnesium oxide according to another aspect of the present disclosure has the following distribution of a particle size. In the distribution of a particle size, the particle size has a maximal frequencies in a first range of from 0.3 μm to 1 μm, inclusive, and in a second range of from 2 μm to 10 μm, inclusive, a maximal volume frequency in the first range is 5% or less, and a maximal volume frequency in the second range is 12% or more. A ratio of 50% accumulated particle size D50 with respect to specific surface area diameter is 4 or less, and a ratio of 90% accumulated particle size D90 with respect to 10% accumulated particle size D10 is 10 or less. Such magnesium oxide is prepared by calcining magnesium oxide precursor at a temperature of from 1,500° C. to 2,000° C., inclusive, crushing the calcined material particles, and classifying the crushed material particles.

According to the present disclosure, there is provided a resin composition for printed circuit board capable of forming a printed circuit board that is excellent in product stability such as moisture resistance and has high heat dissipation. Further, according to the present disclosure, there is provided a prepreg for printed circuit board which includes the above-mentioned resin composition for printed circuit board, and an insulating substrate, a metal-clad laminate, and a printed circuit board, which are produced using the prepreg. Further, according to the present disclosure, there is provided magnesium oxide which is contained in the above-mentioned resin composition for printed circuit board.

DETAILED DESCRIPTION OF THE PREFERRED EMBODIMENT

Figure 1:
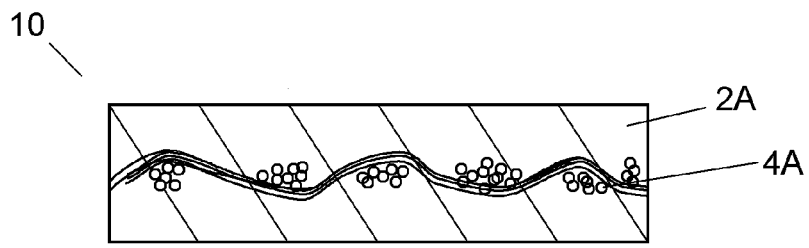
FIG. 1 is a schematic cross sectional view of a prepreg according to an exemplary embodiment of the present disclosure.

Prior to the description of the exemplary embodiment of the present disclosure, problems in the case of using a conventional magnesium oxide will be briefly described. Even when the magnesium oxide particles described in PTL are contained in the resin component for forming a printed circuit board, the product stability of the printed circuit board is not sufficiently increased in some cases. Specifically, the magnesium oxide particles are prepared by mixing magnesium hydroxide with boric acid or its salt, and calcining the resultant mixture. In order to allow the magnesium oxide particles obtained by such a method to be contained in the resin composition for printed circuit board, even when the particles are ground and classified to a suitable particle size, the particles may not become magnesium oxide capable of resolving defects which causes a decrease in the product stability of the printed circuit board.

Hereinafter, the resin composition for printed circuit board according to the exemplary embodiment of the present disclosure will be described, however the present disclosure is not limited thereto.

The resin composition for printed circuit board according to the exemplary embodiment of the present disclosure contains a thermosetting resin and an inorganic filler. The inorganic filler contains magnesium oxide having a particle size distribution described below. That is, the resin composition for printed circuit board contains the thermosetting resin and the inorganic filler. There is no particular limitation as to the inorganic filler so long as the inorganic filler contains the magnesium oxide having a particle size distribution described below.

Specifically, the magnesium oxide has a volume average particle size of from 2 μm to 10 μm, inclusive, and a preferable volume average particle size is in a range from 4 μm to 6 μm, inclusive. Thus, the magnesium oxide has a relatively small particle size so that the resin component for forming a printed circuit board can be filled with the magnesium oxide at a high ratio. Thus, it is possible to produce a printed circuit board having high heat dissipation.

In a particle size distribution, a particle size of the magnesium oxide has a maximal frequencies in a range of from 0.3 μm to 1 μm, inclusive (hereinafter referred to as first range), and in a range of from 2 μm to 10 μm, inclusive (hereinafter referred to as second range). The magnesium oxide particles having a particle size in the second range is relatively large, the moisture resistance is improved. Since the magnesium oxide particles are not too large, the resin component is filled with the magnesium oxide particles at a relatively high ratio. Accordingly, the heat dissipation of the printed circuit board can be improved. Since the magnesium oxide particles having a particle size in the first range is too small, the magnesium oxide particles easily react with water, and thus the moisture resistance tends to be insufficient.

The maximal volume frequency in the first range is 5% or less, and preferably 3% or less. From the viewpoint of moisture resistance, the maximal volume frequency in the first range is preferred to be low, about 1% of which is actually is present. That is, the maximal volume frequency in the first range is from 1% to 5%, inclusive, and preferably from 1% to 3%, inclusive. When the maximal volume frequency in the first range is in the above-mentioned range, the magnesium oxide particle having a small particle size is contained in a small amount. Accordingly, the magnesium oxide particle having low moisture resistance is less incorporated, and the moisture resistance of the whole magnesium oxide increases.

On the other hand, the maximal volume frequency in the second range is 12% or more, and preferably 14% or more. The maximal volume frequency in the second range is preferred to be high. Actually, the maximal volume frequency is considered to be up to about 25%. That is, the maximal volume frequency in the second range is from 12% to 25%, inclusive, and preferably from 14% to 25%, inclusive. When the maximal volume frequency in the second range is in the above-mentioned range, the moisture resistance of the whole magnesium oxide increases. As described above, the magnesium oxide particles having a particle size in the second range has relatively high moisture resistance. Due to the increased amount of such magnesium oxide particles, the moisture resistance of the whole magnesium oxide increases.

A ratio of 50% accumulated particle size D50 with respect to a specific surface area diameter (D50/specific surface area diameter) is 4 or less, and preferably from 1 to 3, inclusive. When the ratio is in the mentioned range, it is possible to produce a printed circuit board having high heat dissipation. This fact is considered to be due to the following reasons. The specific surface area diameter depends on a primary particle size, and D50 depends on a secondary particle size. Therefore, the above ratio indicates an aggregation degree of magnesium oxide particles. A small value of the ratio means that the aggregation of the magnesium oxide particles is suppressed. Hence, it is considered that the low aggregation degree results in an increase in the dispersibility of the magnesium oxide in the resin component of the printed circuit board. Accordingly, it is considered that a printed circuit board having high heat dissipation can be produced by using a resin composition containing the magnesium oxide having such a ratio.

A ratio (D90/D10) of 90% accumulated particle size D90 with respect to 10% accumulated particle size D10 is 10 or less, and preferably 7 or less. When the ratio is in the mentioned range, it is possible to stably produce a printed circuit board that is excellent in moisture resistance and has high heat dissipation. This fact is considered to be due to the following reasons. A small D90/D10 value means that the monodispersity of the particle size distribution is high, namely the particle size distribution is narrow. Therefore, when D90/D10 is in the above-mentioned range, it is possible to prepare a resin composition that contains magnesium oxide excellent in moisture resistance at a relatively high ratio. Accordingly, it is possible to stably produce a printed circuit board that is excellent in moisture resistance and has high heat dissipation by using a resin composition containing the magnesium oxide having such a ratio.

As described above, the use of the resin composition for printed circuit board according to the exemplary embodiment allows for production of a printed circuit board which is excellent in product stability such as moisture resistance and has high heat dissipation.

The particle size distribution of magnesium oxide can be measured by a known method such as a dynamic light scattering method. Specifically, a laser diffraction/scatter type particle size distribution measuring device may be used to perform the measurement. Then, the volume average particle size of the magnesium oxide is calculated from the measured particle size distribution. Further, the maximal volume frequency in the first range and the maximal volume frequency in the second range can be calculated using a ratio of volumes in the measured particle size distribution.

The 50% accumulated particle size D50 is a particle size which is 50% in ascending order of the particle size distribution. In other words, D50 is a 50% accumulated particle size measured with a laser diffraction/scatter type particle size distribution measuring device, and is a so-called median diameter. The 10% accumulated particle size D10 and 90% accumulated particle size D90 are particle sizes which are 10% and 90%, respectively, in ascending order of the particle size distribution. Further, the specific surface area diameter is determined from the specific surface area. That is, the specific surface area diameter means a diameter which is calculated from the specific surface area of particles in the case where the particles are assumed to be spheres. The specific surface area can be measured by a known method such as a BET specific surface area measuring method.

There is no particular limitation as to the specific surface area diameter and D50 of magnesium oxide so long as magnesium oxide has diameters having a ratio of D50 to specific surface area diameter that is in the above range. Specifically, the specific surface area diameter is preferably from 1.3 µm to 7 µm, inclusive. Further, D50 is preferably from 4 µm to 7 µm, inclusive.

There is no particular limitation as to D10 and D90 of magnesium oxide so long as D90/D10 is in the above range. Specifically, D10 is preferably from 1 µm to 4 µm, inclusive. Further, D90 is preferably from 7 µm to 10 µm, inclusive.

Next, the thermosetting resin will be described. There is no particular limitation as to the thermosetting resin used in the exemplary embodiment so long as the thermosetting resin is used for a resin composition for printed circuit board that is used to produce a printed circuit board. Examples of thermosetting resins include epoxy resins and radical polymerization type thermosetting resins such as unsaturated polyester resins and vinyl ester resins. In the case of containing an epoxy resin, a curing agent or a curing accelerator may be added, if necessary. In the case of containing a radical polymerization type thermosetting resin, a radical polymerizable monomer or a radical polymerization agent may be added, if necessary.

The epoxy resin is not particularly limited. Specific examples of epoxy resins include bisphenol-type epoxy resins such as bisphenol A-type epoxy resins, bisphenol F-type epoxy resins, and bisphenol S-type epoxy resins; aralkyl epoxy resins, novolak-type epoxy resins, phenol novolak-type epoxy resins, aralkyl phenol novolak-type epoxy resins, biphenol-type epoxy resins, naphthalene-type epoxy resins (e.g., 1,4-dihydroxynaphthalene-type epoxy resin), dicyclopentadiene-type epoxy resins, alicyclic epoxy resins, heterocyclic epoxy resins, triphenylmethane-type epoxy resins, and phosphorus-containing epoxy resins prepared by modifying those epoxy resins with phosphorus compounds. These resins may be used singly, or in combination of two or more kinds.

There is no particular limitation as to the curing agent used in combination with the epoxy resin so long as the curing agent contributes to the curing of the epoxy resin. Specific examples of curing agents include dicyandiamide-based curing agents, phenol-based curing agents, acid anhydride-based curing agents, aminotriazine novolac-type curing agents, and cyanate resins. These agents may be used singly, or in combination of two or more kinds.

There is no particular limitation as to the curing accelerator used in combination with the epoxy resin so long as the curing accelerator promotes the curing of the epoxy resin. Specific examples of curing accelerators include imidazole-based compounds.

There is no particular limitation as to the radical polymerization type thermosetting resin. Specific examples of radical polymerization type thermosetting resins include resins having at least two radical polymerizable unsaturated groups in a molecule. More specific examples of radical polymerization type thermosetting resins include vinyl ester resins, unsaturated polyesters, and bisphenol A-type methacrylates. The vinyl ester resins are reaction products of an epoxy resin and an unsaturated fatty acid, such as acrylic acid and methacrylic acid. Unsaturated polyesters are reaction products of propylene glycol, bisphenol A-propylene oxide adducts, or the like with a polybasic unsaturated acid such as maleic anhydride and fumaric acid. These substances may be used singly, or in combination of two or more kinds.

There is no particular limitation as to the radical polymerizable monomer used in combination with the radical polymerization type thermosetting resin. Examples of radical polymerizable monomers include monomers having at least one radical polymerizable unsaturated group in a molecule. More specific examples of monomers include styrene, methylstyrene, halogenated styrene, (meth)acrylic acid, methyl methacrylate, ethyl methacrylate, butyl acrylate, divinylbenzene, ethylene glycol di(meth)acrylate, propyleneglycol di(meth) acrylate, trimethylolpropane tri (meth)acrylate, pentaerythritol tri(meth)acrylate, and pentaerythritol tetra(meth)acrylate. These monomers may be used singly, or in combination of two or more kinds.

There is no particular limitation as to the radical polymerization initiator used in combination with the radical polymerization type thermosetting resin so long as the radical polymerization initiator contributes to the curing of the radical polymerization type thermosetting resin. Specific examples of radical polymerization initiators include organic peroxides and inorganic peroxides such as hydrogen peroxide. The organic peroxides include diacyl peroxides, hydro peroxides, dialkyl peroxides, peroxy ketals, alkylperesters, and percarbonates. More specifically, ketone peroxides include methyl ethyl ketone peroxide, methyl isobutyl ketone peroxide, and cyclohexanone peroxide. Diacyl peroxides include benzoyl peroxide and isobutyl peroxide. Hydro peroxides include cumene hydroperoxide and t-butyl hydroperoxide. Dialkyl peroxides include dicumyl peroxide and di-t-butyl peroxide. Peroxy ketals include 1,1-di-t-butyl peroxy-3,3,5-trimethylcyclohexanone and 2,2-di-(t-butyl peroxy)-butane. Alkylperesters include t-butylperbenzoate and t-butylperoxy-2-ethylhexanoate. Percarbonates include bis(4-t-butylcyclohexyl)peroxydicarbonate and t-butyl peroxyisobutyl carbonate. These organic peroxides may be used singly, or in combination of two or more kinds.

There is no particular limitation as to the method for manufacturing magnesium oxide so long as the method is capable of manufacturing magnesium oxide having the above particle size distribution. A specific example includes a method including: calcining magnesium oxide precursor at a temperature of from 1500° C. to 2000° C., inclusive; crushing the calcined material particles; and classifying the crushed particles.

There is no particular limitation as to the magnesium oxide precursor so long as the magnesium oxide precursor is calcined to prepare magnesium oxide. Specific examples of magnesium oxide precursors include magnesium hydroxide, magnesium carbonate, and magnesium oxalate. Among them, magnesium hydroxide and magnesium carbonate are preferred from the viewpoint of easily preparing magnesium oxide having the particle size distribution. These magnesium oxide precursors may be used singly, or in combination of two or more kinds.

There is no particular limitation as to the calcining method. For example, there is a calcining process in a thermal decomposition method which is a method for manufacturing magnesium oxide. Further, the calcination temperature is preferably from 1500° C. to 2000° C., inclusive, and more preferably from 1600° C. to 1900° C., inclusive. When the calcination temperature is in the above-mentioned range, magnesium oxide is sufficiently formed. It is possible to produce magnesium oxide having the particle size distribution by crushing and classifying the calcined material particles. There is no particular limitation as to the calcination time so long as the calcination time is the time required to sufficiently produce magnesium oxide from a magnesium oxide precursor.

There is no particular limitation as to the crushing and classifying method so long as the method is capable of forming the calcined material particles obtained by calcination into magnesium oxide having the above particle size distribution. The crushing process loosens the particles aggregated by calcination. In other words, the crushing process is a process of loosening secondary particles without breaking primary particles of the magnesium oxide. Specifically, the calcined material particles can be crushed by using a disintegrator such as an impact mill or atomizer, or a medium stirring type grinder such as a bead mill. The device for performing a crushing process is preferably a disintegrator such as an impact mill or atomizer, from the viewpoint of reducing the occurrence of overgrinding. Single crystals in overground magnesium oxide particles are broken, and thus various lattice defects occur on the surfaces of the crystals. As a result, the particles do not exhibit sufficient moisture resistance and tends to have a low fluidity.

Further, the crushing and classifying method is preferably a process for achieving the condition that 99% accumulated particle size D99 is 20 μm or less, and a ratio of most frequent particle size with respect to volume average particle size (most frequent particle size/volume average particle size) is from 1 to 1.5, inclusive. That is, D99 of the magnesium oxide is preferably 20 μm or less, and more preferably from 10 μm to 15 μm, inclusive. When D99 is in the above range, it is possible to stably produce a printed circuit board excellent in insulation.

D99 is recognized as the maximum particle size of particles other than larger particles inevitably included. Hence, the particles having the larger particle size are removed by classifying the particles so that the D99 value is 20 μm or less.

In the case of manufacturing a printed circuit board using a resin composition containing magnesium oxide particles having to large D99, cracks are easily formed at the interface between resin and magnesium oxide. Thus, there is a tendency for the insulation of the printed circuit board to decrease. Therefore, when the magnesium oxide particles do not contain particles having a large particle size, it is possible to prepare a resin composition that is filled with magnesium oxide excellent in moisture resistance at a relatively high ratio. Thus, the use of the magnesium oxide particles that do not contain particles having a large particle size allows for stable production of a printed circuit board excellent in insulation.

Further, a known method may be used for the classifying process. Preferably, the classifying process can remove the following magnesium oxide particles. First, it is preferable that the classifying process can remove magnesium oxide particles having a too large particle size, specifically, magnesium oxide particles having a particle size of more than 20 μm. It is also preferable that the classifying process can remove magnesium oxide particles having a too small particle size, specifically, magnesium oxide particles having a particle size of 1 μm or less which are produced by overgrinding. Thus, it is preferable that the classifying process can remove both the magnesium oxide particles having a too large particle size and the magnesium oxide particles having a too small particle size.

The ratio of most frequent particle size with respect to volume average particle size (most frequent particle size/volume average particle size) of the magnesium oxide is preferably from 1 to 1.5, inclusive, and more preferably from 1 to 1.3, inclusive. When the ratio is in the above range, it is possible to stably produce a printed circuit board that is excellent in moisture resistance and has high heat dissipation.

A small ratio of most frequent particle size/volume average particle size means that the monodispersity of the particle size distribution is high, namely the particle size distribution is narrow. Therefore, when the ratio of most frequent particle size/volume average particle size is in the above range, it is possible to prepare a resin composition that is filled with magnesium oxide excellent in moisture resistance at a relatively high ratio. Accordingly, it is possible to stably produce a printed circuit board that is excellent in moisture resistance and has high heat dissipation by using a resin composition containing the magnesium oxide having the ratio that is in the above range.

The most frequent particle size is a so-called mode diameter, which is the most frequent particle size in the particle size distribution, i.e., a particle size of particles that are the highest amount.

The most frequent particle size of the magnesium oxide is preferably a particle size satisfying the condition that the ratio of most frequent particle size/volume average particle diameter is in the above range. Specifically, the most frequent particle size is preferably from 4 μm to 9 μm, inclusive.

The inorganic filler used in the exemplary embodiment may contain magnesium oxide having the particle size distribution. In other words, the inorganic filler may contain only magnesium oxide, or may contain magnesium oxide and an inorganic filler other than the magnesium oxide. In the case of containing an inorganic filler other than the magnesium oxide, the magnesium oxide content is preferably 10 parts by mass or more, and more preferably 30 parts by mass or more with respect to the total amount of 100 parts by mass of the inorganic filler. The magnesium oxide content is in the above range so that the effect of addition of the magnesium oxide can be exerted. Since only the magnesium oxide may be included in the inorganic filler, the upper limit of the magnesium oxide content is 100 parts by mass with respect to the total amount of 100 parts by mass of the inorganic filler.

There is no particular limitation as to the inorganic filler other than the magnesium oxide so long as the inorganic filler is contained in a resin composition for printed circuit board. Specific examples of inorganic fillers include silica such spherical silica, talc, alumina, aluminium nitride, aluminium hydroxide, magnesium hydroxide, titanium oxide, mica, aluminium borate, barium sulfate, and calcium carbonate.

The inorganic filler may be preliminarily surface-treated with an epoxysilane- or aminosilane-type silane coupling agent. That is, the magnesium oxide may also be preliminarily surface-treated with the silane coupling agent, and the inorganic filler other than the magnesium oxide may also be preliminarily surface-treated with the silane coupling agent.

The inorganic filler content is preferably from 60 parts by mass to 90 parts by mass, inclusive, with respect to the total mass of 100 parts by mass of the thermosetting resin and the inorganic filler. That is, the thermosetting resin content is preferably from 10 parts by mass to 40 parts by mass, inclusive, with respect to the total mass of 100 parts by mass of the thermosetting resin and the inorganic filler. When the content is in the above range, a printed circuit board obtained using the resin composition for printed circuit board can keep a suitable shape and sufficiently exhibit heat dissipation.

The resin composition for printed circuit board according to the exemplary embodiment is preferably in liquid form. Therefore, at least one kind of thermosetting resins to be contained in the resin composition is preferably in liquid form. Accordingly, the resin composition can be easily impregnated in the fiber base member during the production of a prepreg using the resin composition for printed circuit board. Consequently, it is possible to produce a suitable prepreg. As a result, in a printed circuit board produced using the prepreg, the occurrence of problems such as dissociation between the resin component and the fiber base member is reduced.

The resin composition for printed circuit board according to the exemplary embodiment may contain a component other than a thermosetting resin and an inorganic filler in a range that does not inhibit desired target characteristics. Specifically, the resin composition may contain an additive such as a heat stabilizer, an antistat, an ultraviolet absorber, a dye, a pigment or a lubricant.

When the resin composition for printed circuit board according to the exemplary embodiment is used to produce a prepreg, a base member (fiber base member) for forming a prepreg is impregnated with the resin composition. Thus, the resin composition for printed circuit board is preferably in liquid form. The resin composition is formed into a varnish containing a solvent in many cases. The varnish-like resin composition is prepared, for example, in the following manner.

First, a resin component such as a thermosetting resin is dissolved in a solvent. In this process, the mixture may be heated, if necessary. Thereafter, a component insoluble in a solvent, for example, inorganic filler is added, and the resultant mixture is dispersed to a predetermined degree by a high speed disper, a planetary mixer or a roll mill. Through the above processes, the varnish-like resin composition is prepared. Alternatively, a medium stirring type disperser such as a ball mill or bead mill may be used in place of the high speed disper. Among these devices, a high speed disper, a planetary mixer, and a roll mill are preferred from the viewpoint of suppressing the breakage of magnesium oxide particles. In the case of using an inorganic filler which is not easily dispersed, for example, the following process may be performed. Such an inorganic filler is added to a mixture of a resin component and a solvent and the resultant mixture is dispersed to a predetermined degree by the medium stirring type disperser. Then, the magnesium oxide used in the exemplary embodiment is added to the dispersion. Then, the dispersion is further dispersed to a predetermined degree by the high speed disper, planetary mixer or roll mill.

There is no particular limitation as to the solvent so long as the solvent dissolves a resin component such as a thermosetting resin and does not inhibit a curing reaction. Specific examples of solvents include organic solvents such as methyl ethyl ketone.

Next, the prepreg using the resin composition for printed circuit board will be described. The prepreg will be described with reference to FIG. 1. FIG. 1 is a cross-sectional view of a prepreg according to the exemplary embodiment. As described above, prepreg 10 can be produced by impregnating fiber base member 4A with resin composition 2A. Specifically, liquid or varnish-like resin composition 2A may be used to produce prepreg 10. For example, there is a method including: impregnating fiber base member 4A with liquid resin composition 2A or varnish-like resin composition 2A (resin varnish); and drying the impregnated fiber base member. In prepreg 10, fiber base member 4A impregnated with resin composition 2A is heated, whereby resin composition 2A with which fiber base member 4A is impregnated may be in a semi-hardened state. That is, prepreg 10 in a semi-hardened state (B stage) can be produced by heating fiber base member 4A impregnated with resin composition 2A under predetermined heating conditions, for example, at a temperature in a range from 80° C. to 170° C. for a period from 1 minute to 10 minutes.

There is no particular limitation as to fiber base member 4A so long as the fiber base member 4A is for forming a prepreg which is used to produce a printed circuit board. Specific examples of fiber base member 4A include glass cloth, aramid cloth, polyester cloth, glass nonwoven fabric, aramid nonwoven fabric, polyester nonwoven fabric, pulp paper, and linter paper. The use of glass cloth allows for production of a laminate and a printed circuit board which have excellent mechanical strength. Particularly, a glass cloth processed into a flat shape is preferable. Specifically, for example, a flat-shaped glass cloth can be obtained by successively pressurizing a glass cloth with press rolls at an appropriate pressure so that the yarns are compressed into a flat shape. Generally, the thickness of fiber base member 4A is, for example, in a range from 0.04 mm to 0.3 mm.

Fiber base member 4A is impregnated with resin composition 2A by immersing or coating. If necessary, it is also possible to repeat the impregnating process multiple times. In this case, the impregnating process is repeatedly performed on a plurality of resin compositions different in composition and concentration from each other so that the composition and amount of the resins can be finally adjusted to a desired level.

As described above, prepreg 10 used to produce a printed circuit board includes fiber base member 4A and resin composition 2A with which fiber base member 4A is impregnated. The use of prepreg 10 for manufacturing a printed circuit board allows for production of a printed circuit board which has high heat dissipation and is excellent in product stability such as moisture resistance.

Next, laminate 15, metal-clad insulating substrate 20, and printed circuit board 30 using prepreg 10 will be described with reference to FIGS. 2 to 4.

Figure 2:
FIG. 2 is a schematic cross sectional view of a laminate according to an exemplary embodiment of the present disclosure.

Laminate 15 shown in FIG. 2 can be formed by laminating a plurality of prepregs 10, molding the laminated prepregs 10, and hardening the molded prepregs 10. Specifically, laminate 15 can be produced by laminating a plurality of prepregs 10, heat press-molding the laminated body for integration. The heating and pressing conditions can be appropriately set according to the thickness of laminate 15 to be produced and the kind of resin composition 2A contained in prepreg 10. For example, the temperature is set to a range from 170° C. to 210° C., the pressure is set to a range from 2 MPa to 5 MPa, and the time is set to a range from 60 minutes to 150 minutes. In the case where only one sheet of prepreg 10 is molded and hardened, it is possible to produce an insulating substrate. Hence, laminate 15 is a type of insulating substrate.

As described above, laminate 15 has a plurality of laminated insulating layers 12 each which is a hardened substance of prepreg 10 shown in FIG. 1. Laminate 15 containing a hardened substance of resin composition 2A as a resin component has high heat dissipation and is excellent in product stability such as moisture resistance.

Figure 3:
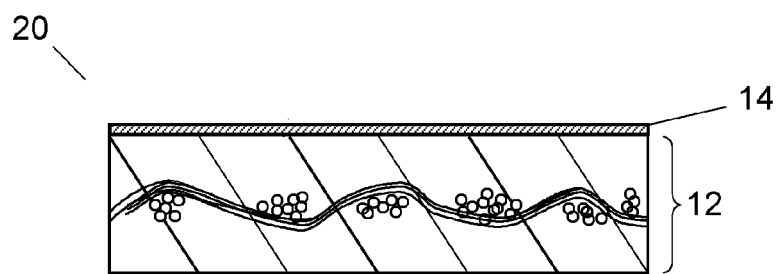
FIG. 3 is a schematic cross sectional view of a metal-clad laminate according to an exemplary embodiment of the present disclosure.

As shown in FIG. 3, for example, metal-clad laminate 20 can be produced by laminating metal foil 14 such as copper foil on one surface of prepreg 10 and heat press-molding the laminated body. That is, metal-clad laminate 20 includes insulating layer 12 which is a hardened substance of prepreg 10 shown in FIG. 1 and metal foil 14 laminated on insulating layer 12. Alternatively, two sheets of metal foil 14 may be laminated on both surfaces of prepreg 10, respectively. Further, a plurality of prepregs 10 may be laminated, or laminate 15 may be used in place of prepreg 10.

Alternatively, insulating substrate or laminate 15 can be produced by peeling metal foil 14 from metal-clad laminate 20 obtained by laminating metal foil 14 on one or more sheets of prepregs 10, and heat press-molding the laminated body.

The heating and pressing condition can be set to the same condition of laminate 15. Metal-clad laminate 20 containing a hardened substance of resin composition 2A has high heat dissipation and is excellent in product stability such as moisture resistance.

Figure 4:
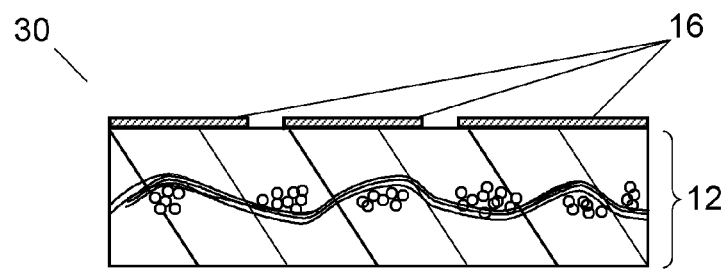
FIG. 4 is a schematic cross sectional view of a printed circuit board according to an exemplary embodiment of the present disclosure.

As shown in FIG. 4, printed circuit board 30 using prepreg 10 can be produced from metal-clad laminate 20. That is, printed circuit board 30 can be produced by processing metal foil 14 of metal-clad laminate 20 into a circuit. Specifically, metal foil 14 is etched to form a circuit so that printed circuit board 30 having conductor pattern 16 as a circuit formed thereon can be produced.

That is, printed circuit board 30 has insulating layer 12 which is a hardened substance of prepreg 10 shown in FIG. 1 and conductor pattern 16 formed on insulating layer 12. Printed circuit board 30 containing a hardened substance of resin composition 2A has high heat dissipation and is excellent in product stability such as moisture resistance.

Hereinafter, the exemplary embodiment will be more specifically described with reference to specific samples; however, the scope of the present disclosure is not limited thereto.

First, a thermosetting resin used for each of the samples will be described. As the thermosetting resin, a phosphorus-containing epoxy resin produced by the following method is used for each of the samples.

(Phosphorus-Containing Epoxy Resin) Into a four-necked glass separable flask equipped with a stirrer, a thermometer, a condenser tube, and a nitrogen gas introduction unit are charged with 130 parts by mass of 9,10-dihydro-9-oxa-10-phosphaphenanthrene-10-oxide (HCA) and 400 parts by mass of xylene as a reaction solvent. HCA is dissolved in xylene by heating these ingredients (contents). Thereafter, 94 parts by mass of 1,4-naphthoquinone is put into the flask, and 1,4-naphthoquinone is reacted with HCA. In order to avoid a sudden temperature rise due to heat of reaction, 1,4-naphthoquinone is divisionally charged. The amount of HCA, phosphorus compound to be charged, is 1.02 mol with respect to 1 mol of 1,4-naphthoquinone.

After the reaction, 300 parts by mass of the solvent is extracted from the reaction solution in the flask. After that, 350 parts by mass of triphenylmethane-type epoxy resin, 250 parts by mass of 1,4-dihydroxynaphthalene-type epoxy resin, 176 parts by mass of bisphenol F-type epoxy resin, and 0.22 part by mass of triphenyl phosphine are charged to the flask. The triphenylmethane-type epoxy resin is EPPN-501H, manufactured by Nippon Kayaku Co., Ltd. (trifunctional epoxy resin, epoxy equivalent: 165 g/eq). The 1,4-dihydroxynaphthalene-type epoxy resin is Epotohto ZX-1355, manufactured by Tohto Kasei Co., Ltd. (epoxy equivalent: 145 g/eq). The bisphenol F-type epoxy resin is Epotohto YDF-170, manufactured by Tohto Kasei Co., Ltd. (epoxy equivalent: 168 g/eq). Triphenyl phosphine serves as a catalyst. The ingredients are heated and stirred at 160° C. for 4 hours while nitrogen gas is introduced into the ingredients, and further the solvent is extracted. The processes promote the further reaction of the reaction product of 1,4-naphthoquinone and HCA with each of the epoxy resins. The obtained epoxy resin is modified with a phosphorus compound. Hence, a phosphorus-containing epoxy resin is prepared. The phosphorus-containing epoxy resin has an epoxy equivalent of 273.5 g/eq and a phosphorus content of 1.85% by mass.

Next, the method for manufacturing magnesium oxide used for each of the samples will be described.

(Magnesium Oxide A)

Figure 5:
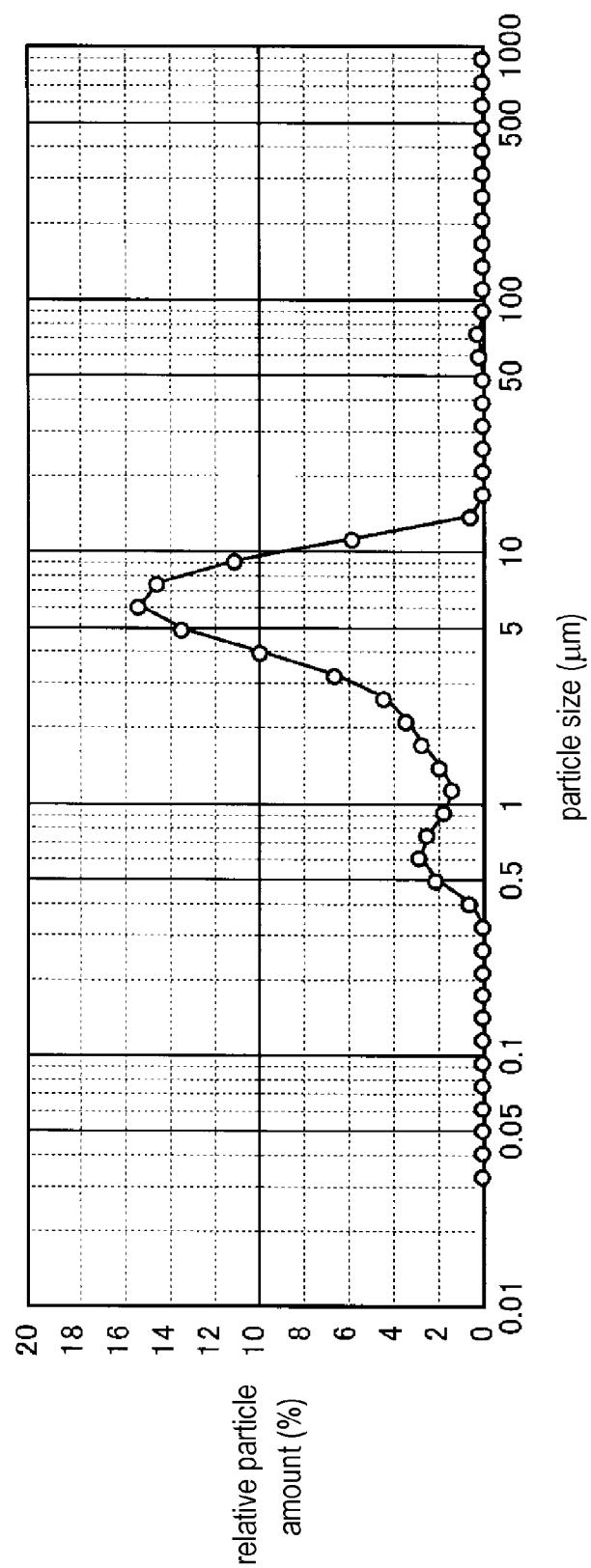
FIG. 5 is a graph showing a particle size distribution of magnesium oxide used for Sample EA.

First, a magnesium hydroxide as magnesium oxide precursor is calcined at 1,800° C. for 10 hours. Then, the calcined material particles are crushed using a disintegrator (Impact Mill, manufactured by DALTON CO. LTD.) Finally, the crushed particles are classified with a classifier (MICRON SEPARATOR MS-1, manufactured by HOSOKAWA MICRON CORPORATION), and magnesium oxide A is prepared. FIG. 5 shows a particle size distribution of magnesium oxide A. Magnesium oxide A is used for Sample EA described below. In FIG. 5, a horizontal axis indicates a particle size (μm), meanwhile, a vertical axis indicates a relative particle amount (%) which is the probability of the presence of particles having different particle sizes.

Magnesium oxide A has a volume average particle diameter of 4.3 μm. The maximal volume frequency in a particle size range of from 0.3 μm to 1 μm, inclusive, is 3%. The maximal volume frequency in a particle size range of from 2 μm to 10 μm, inclusive, is 16%. The specific surface area is 0.7 m$^2$/g, the specific surface area diameter is 2.4 μm, and the ratio of D50 (median diameter)/specific surface area diameter is 3.2. D90/D10 is 7. D99 is 9.9 μm and a ratio of most frequent particle size (mode diameter)/volume average particle diameter is 1.3.

Values of physical properties concerning the particle size distribution are collectively shown in Table 1.

A laser diffraction/scatter type particle size distribution measuring device (SALD-2100, manufactured by Shimadzu Corporation) may be used to measure the particle size distribution. Then, the volume average particle diameter, each of the maximal volume frequencies, D10, D50, D90, D99, and the most frequent particle size are calculated from the measured particle size distribution.

The BET specific surface area measuring method may be used to measure the specific surface area. Specifically, the specific surface area is measured by a gas adsorption method using a measuring device (TriStar II 3020, manufactured by Shimadzu Corporation). Then, the specific surface area diameter, which is a diameter when particles are assumed to be spheres, is calculated from the measured specific surface area.

(Magnesium Oxides B to D)

Magnesium oxides B to D are prepared in the same manner as magnesium oxide A except that the conditions for crushing and classifying are changed so as to have the particle size distribution shown in Table 1. Magnesium oxides B to D are respectively used for Samples EB to ED described below.

(Magnesium Oxide E)

Figure 6:
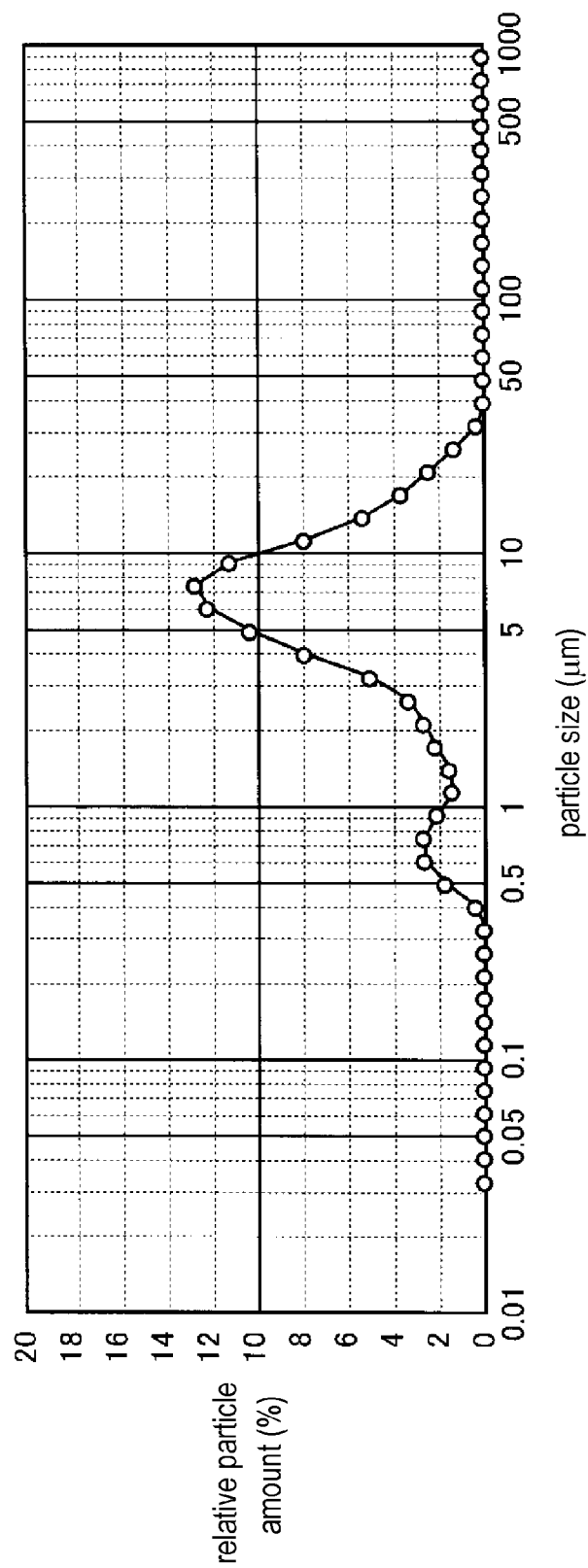
FIG. 6 is a graph showing a particle size distribution of magnesium oxide used for Sample CA.

Magnesium oxide E is prepared in the same manner as magnesium oxide A except that the classifying method is not performed, and magnesium oxide is crushed so as to have the particle size distribution shown in Table 1. FIG. 6 shows a particle size distribution of magnesium oxide E. Magnesium oxide E is used for Sample CA described below. The horizontal and vertical axes in FIG. 6 are the same as those in FIG. 5.

(Magnesium Oxide F)

Figure 7:
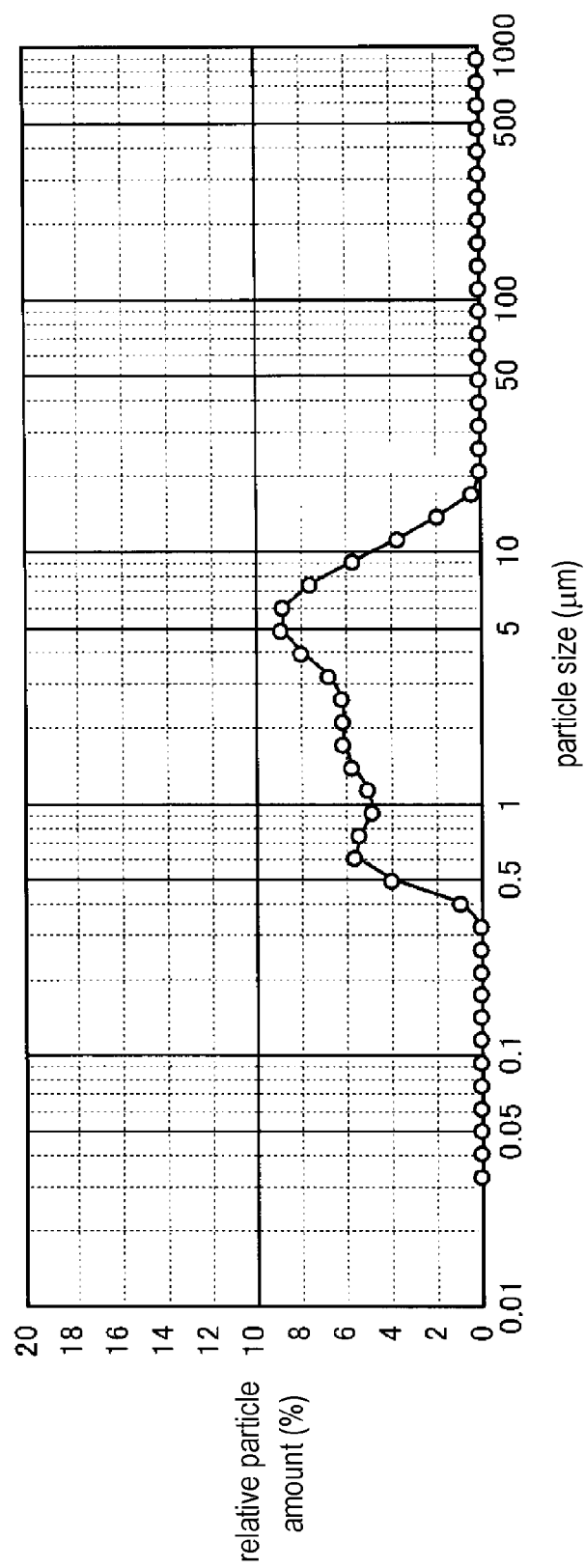
FIG. 7 is a graph showing a particle size distribution of magnesium oxide used for Sample CB.

Magnesium oxide F is prepared in the same manner as magnesium oxide A except that the crushing and classifying methods are not performed, and magnesium oxide is ground using a ball mill so as to have the particle size distribution shown in Table 1. FIG. 7 shows a particle size distribution of magnesium oxide F. Magnesium oxide F is used for Sample CB described below. The horizontal and vertical axes in FIG. 7 are the same as those in FIG. 5.

[Sample EA]

A resin composition is prepared by blending and stirring 100 parts by mass of phosphorus-containing epoxy resin, 3.2 parts by mass of dicyandiamide (Dicy)-based curing agent, and 550 parts by mass of magnesium oxide A.

A glass cloth having a basic density of 47 g/m$^2$ and a thickness of 53 μm (manufactured by Nitto Boseki Co., Ltd.) is impregnated with the obtained resin composition. Thereafter, the resin composition is semi-hardened by heating in a non-contact type heating unit at 150° C. and removing the solvent in the varnish while drying. The prepreg is produced in this manner. During the production, the amount of solvent to be removed is adjusted such that the resin content of the phosphorus-containing epoxy resin and resin components such as the dicyandiamide (Dicy)-based curing agent is about 80% by volume, that is, cloth volume is about 20% by volume.

After that, eight sheets of prepregs are laminated one on top of another and two sheets of 0.018 mm-thick copper foil are respectively laminated on both of 2-sided surfaces of the laminated object to form a laminated body. The laminated body is inserted between two metal plates, followed by heat pressing at 180° C. and 3 MPa for 2 hours. Thus, a copper-clad laminate (metal-clad laminate) having a thickness of about 0.8 mm is produced.

[Samples EB to ED, Sample CA, and Sample CB]

A resin composition, a prepreg, and a metal-clad laminate of each of samples EB to ED, sample CA, and sample CB are produced in the same manner as sample EA except that magnesium oxides B to F are respectively used in place of magnesium oxide A.

The following method is used to evaluate each of the prepregs and the metal-clad laminates produced in the above manner.

[Characteristics of Prepreg: Moldability]

The above method is used to produce prepregs having different melt viscosities (3000 poise, 9000 poise, 15000 poise, 21000 poise). After that, two sheets of copper foil (thickness: 18 μm, GT foil, manufactured by FURUKAWA ELECTRIC CO., LTD) are laminated on both surfaces of a prepreg (340 mm×510 mm) such that a roughened surface of the copper foil is in contact with the prepreg. The laminated body is molded by heat-pressing at 180° C. and 3 MPa for 90 minutes to produce a copper-clad laminate. The copper foil is removed from the obtained copper-clad laminate by etching. The etched laminate is observed from the surface. Further, five segments are arbitrarily taken from an end and a center of the etched copper-clad laminate. Then, the cross-section of each of the segments is observed. The length of the cross section is 20 mm. As a result of the observation, as for all melt viscosity measurement, when neither voids nor thin spots are confirmed, the moldability is evaluated as "OK (Okay)". On the other hand, when voids and/or thin spots are confirmed, the moldability is evaluated as "NG (No Good)."

In the results obtained by measuring each of the prepregs having different melt viscosity, when there is no "NG" in each of the evaluations, the moldability is comprehensively evaluated as "EX (Excellent)". Further, when there are one or two "NGs" in each of the evaluations, the moldability is evaluated as "GD (Good)". When there are three or more "NGs" in each of the evaluations, the moldability is evaluated as "NG".

The melt viscosity can be measured in the following manner. A resin composition powder is taken out by loosening a prepreg. Foreign substances such as glass fiber are removed by passing the powder through a 60-mesh filter. The filtered powder is pelletized using a pelletizing press. Using this pellet, melt viscosity at 130±0.2° C. is measured by a Koka-type flow tester (CTF-100, manufactured by Shimadzu Corporation). Specifically, the measurement is performed using a nozzle having 0.5 mm in diameter and 10 mm in length under the condition of temperature: 130±0.2° C., load: 20 kg/cm$^2$, plunger area: 1.0 cm$^2$, preheating time: 30 seconds.

[Characteristics of Metal-Clad Laminate]

(1. PCT Solder Heat Resistance)

PCT solder heat resistance is measured by the following method. First, a copper-clad laminate is cut to form a test sample having a size of 50 mm in length and 50 mm in width. The test sample is subjected to pressure cooker test (PCT) at a temperature of 121° C. and a humidity of 100% under a pressure of 2 atm (0.2 MPa) for 6 hours using a pressure cooker test machine. Three test samples after PCT are immersed in a solder tank at 260° C. for 20 seconds. Then, the presence of measling or blistering of the immersed test samples is visually observed. When the occurrence of measling or blistering of all the test samples (three samples) is not confirmed, the PCT solder heat resistance is evaluated as "EX". When the occurrence of measling or blistering is confirmed on one of the three samples, but is not confirmed on the rest two samples, the PCT solder heat resistance is evaluated as "GD". Further, when the occurrence of measling or blistering is confirmed on two or more out of the three samples, the PCT solder heat resistance is evaluated as "NG".

(Thermal Conductivity)

First, the density of the obtained copper-clad laminate is measured by a method of collecting gas over water. Specific heat of the copper-clad laminate is measured by DSC (differential scanning calorimetry). Then, the thermal diffusivity of the copper-clad laminate is measured by a laser flash method. Based on these measured values, the thermal conductivity is calculated using the following equation. Units of density, specific heat, thermal diffusivity, and thermal conductivity are kg/m$^3$, J/kg·K, m$^2$/s, and W/m·K, respectively.

$$\text{Thermal conductivity} = \text{density} \times \text{specific heat} \times \text{thermal diffusivity}$$

(Insulation Reliability)

First, a part of copper foil at the center of the copper-clad laminate is remained, and the remaining copper foil is removed by etching. Then, a voltage of 50 V is applied to the remained copper foil serving as an electrode connection part under high-temperature and high-humidity conditions of 85° C. and 85%. The resistance value in a thickness direction of the laminate is measured. Based on this resistance value, the insulation reliability is evaluated. Specifically, when the resistance value after 1000 hours is $1\times10^8 \Omega$ or more, the insulation reliability is evaluated as "OK", meanwhile, when the resistance value after 1000 hours is less than $1\times10^8 \Omega$, the insulation reliability is evaluated as "NG".

Table 1 shows the results evaluated by the above evaluation methods as well as values of physical properties in accordance with the particle size distribution of magnesium oxide (MgO).

TABLE 1

| | Sample | EA | EB | EC | ED | CA | CB | CC |
|---|---|---|---|---|---|---|---|---|
| MgO | Type | A | B | C | D | E | F | G |
| | Volume average particle diameter (μm) | 4.3 | 3.9 | 4.6 | 2.5 | 6.7 | 2.7 | 2.0 |
| | D50 (μm) | 5.0 | 4.4 | 5.0 | 3.2 | 7.5 | 3.0 | 2.5 |
| | Maximal volume frequency (%) 2-10 μm | 16.0 | 16.0 | 14.0 | 14.0 | 12.0 | 9.0 | 18.0 |
| | 0.3-1 μm | 3.0 | 3.0 | 5.0 | 4.0 | 4.0 | 6.0 | 7.0 |
| | Specific surface area (m$^2$/g) | 0.7 | 0.8 | 1.3 | 0.9 | 0.8 | 3.0 | 2.5 |
| | Specific surface area diameter (μm) | 2.4 | 2.1 | 1.3 | 1.9 | 2.1 | 0.6 | 0.7 |
| | Ratio of D50/specific surface area diameter | 2.0 | 2.1 | 3.8 | 1.7 | 3.5 | 5.3 | 3.6 |
| | D10 (μm) | 1.4 | 1.1 | 1.0 | 0.6 | 4.1 | 0.5 | 0.4 |
| | D90 (μm) | 9.3 | 7.9 | 9.6 | 6.0 | 15.0 | 8.7 | 6.0 |
| | D90/D10 | 6.6 | 7.2 | 9.6 | 8.0 | 3.7 | 17.4 | 15.0 |
| | D99 (μm) | 9.9 | 9.2 | 12.5 | 8.5 | 48.3 | 14.4 | 8.5 |
| | Most frequent particle size (μm) | 6.0 | 4.9 | 6.9 | 3.3 | 8.7 | 4.9 | 3.3 |
| | Ratio of most frequent particle size/volume average particle diameter | 1.4 | 1.3 | 1.5 | 1.3 | 1.3 | 1.8 | 1.7 |
| Evaluation | Prepreg Moldability (comprehensive evaluation) | EX | EX | GD | EX | GD | NG | GD |
| | 3000 poise | OK | OK | OK | OK | OK | OK | OK |
| | 9000 poise | OK | OK | OK | OK | OK | NG | OK |
| | 15000 poise | OK | OK | OK | OK | NG | NG | NG |
| | 21000 poise | OK | OK | NG | OK | NG | NG | NG |

TABLE 1-continued

| Sample | | EA | EB | EC | ED | CA | CB | CC |
|---|---|---|---|---|---|---|---|---|
| Laminate | PCT solder heat resistance | EX | EX | GD | EX | EX | NG | NG |
| | Thermal conductivity (W/m · K) | 2 | 2 | 2 | 2 | 2 | 2 | 2 |
| | Insulation Reliability | OK | OK | OK | OK | NG | NG | OK |

As is clear from Table 1, in Samples EA to ED using magnesium oxides A to D which are in each of the numerical ranges of the magnesium oxide according to the exemplary embodiment as inorganic fillers, the moldability of the prepreg and the moisture resistance of the laminate are high, compared to Samples CA to CC.

Further, FIGS. 5 to 7 indicate that magnesium oxide A contains a higher content of magnesium oxide particles having a particle size of about 6 µm, as compared to magnesium oxide E or magnesium oxide F. Such a higher content of magnesium oxide particles having a particle size of about 6 µm contributes to improvement of moisture resistance.

FIG. 7 indicates that the particle size distribution of magnesium oxide F produced by grinding is wide, and the content of magnesium oxide having low moisture resistance is increased. Thus, the moisture resistance of sample CB using magnesium oxide F is insufficient. As for magnesium oxide G produced by crushing, the classification method is performed by removing only coarse particles. Thus, the maximal volume frequency in a particle size range of from 0.3 µm to 1 µm, inclusive, is high. Thus, the moisture resistance of sample CC using magnesium oxide G is also insufficient. Further, even when magnesium oxide E produced by crushing not to form fine particles having a particle size of 1 µm or less is not classified, the content of particles having a too large particle size is increased as shown in FIG. 6. Thus, the moisture resistance and insulation of sample CA using magnesium oxide E are degraded as compared to samples EA to ED.

As described above, a laminate, a metal-clad laminate, and a printed circuit board, each produced using the prepreg containing the resin composition according to the present disclosure have heat dissipation, insulation, and moisture resistance. Accordingly, the laminate, the metal-clad laminate, and the printed circuit board can be suitably used for electronic devices.

What is claimed is:

1. A resin composition for printed circuit board, comprising:
    a thermosetting resin; and
    an inorganic filler containing a magnesium oxide,
    wherein a volume average particle size of the magnesium oxide is from 2 µm to 10 µm, inclusive,
    in a distribution of a particle size of the magnesium oxide, the particle size has maximal frequencies in a first range of from 0.3 µm to 1 µm, inclusive, and in a second range of from 2 µm to 10 µm, inclusive, a maximal volume frequency in the first range is 5% or less, and a maximal volume frequency in the second range is 12% or more,
    a ratio of 50% accumulated particle size D50 with respect to a specific surface area diameter of the magnesium oxide is 4 or less, and
    a ratio of 90% accumulated particle size D90 with respect to 10% accumulated particle size D10 of the magnesium oxide is 10 or less.

2. The resin composition according to claim 1, wherein in the magnesium oxide, 99% accumulated particle size D99 is 20 µm or less, and a ratio of most frequent particle size with respect to a volume average particle size is from 1 to 1.5, inclusive.

3. The resin composition according to claim 1, wherein a content of the inorganic filler is in a range from 60 parts by mass to 90 parts by mass, inclusive, with respect to a total mass of 100 parts by mass of the thermosetting resin and the inorganic filler, and
    a content of the magnesium oxide is equal to or greater than 30 parts by mass with respect to a total mass of 100 parts by mass of the inorganic filler.

4. A prepreg for printed circuit board, comprising:
    a fiber base member, and
    the resin composition for printed circuit board according to claim 1 with which the fiber base member is impregnated.

5. An insulating substrate which is a hardened substance of the prepreg for printed circuit board according to claim 4.

6. A metal-clad laminate, comprising:
    an insulating layer which is the hardened substance of the prepreg for printed wiring board according to claim 4; and
    a metal foil laminated on the insulating layer.

7. A printed circuit board, comprising:
    an insulating layer which is the hardened substance of the prepreg according to claim 4; and
    a conductor pattern formed on the insulating layer.

* * * * *